United States Patent [19]
Nichols

[11] Patent Number: 5,801,923
[45] Date of Patent: Sep. 1, 1998

[54] MOUNTING MULTICHIP AND SINGLE CHIP MODULES ON PRINTED WIRING BOARDS

[75] Inventor: Randolph G. Nichols, New Port Richey, Fla.

[73] Assignee: Honeywell Inc., Minneapolis, Minn.

[21] Appl. No.: 818,511

[22] Filed: Mar. 14, 1997

[51] Int. Cl.$^6$ .................................................. H05K 7/20
[52] U.S. Cl. ........................ 361/704; 361/707; 361/715; 361/718; 361/719; 361/770; 257/711; 257/717; 174/138 G; 174/252
[58] Field of Search .................................. 361/704, 712, 361/715, 718, 719, 728, 770, 771; 257/711, 717; 174/138 G, 252

[56] References Cited

U.S. PATENT DOCUMENTS

| | | | |
|---|---|---|---|
| 4,748,538 | 5/1988 | Tsuji | 361/715 |
| 5,459,639 | 10/1995 | Izumi | 361/707 |

Primary Examiner—Leo P. Picard
Assistant Examiner—Boris L. Chervinsky
Attorney, Agent, or Firm—Robert E. Greenstien

[57] ABSTRACT

A multichip module is attached to a printed wire circuit board using three conductive mounting feet that are vapor phase soldered to conductive feet on the module's substrate and to conductive feet on the printed wiring circuit board that are connected to a ground plane on the board.

3 Claims, 1 Drawing Sheet

MOUNTING MULTICHIP AND SINGLE CHIP MODULES ON PRINTED WIRING BOARDS

TECHNICAL FIELD OF THE INVENTION

This invention relates to multichip modules and single chip modules, in particular, techniques for mounting these "modules" on printed wiring boards.

BACKGROUND OF THE INVENTION

A multichip module is a plurality of integrated circuit components that are mounted on a substrate which is attached to a printed wiring board containing electrical ground planes and vias to provide power and signal connections to the module. As compared to the integrated circuit components, which can be numerous on the multichip module, the multichip module is large. Some modules, for instance those used in sophisticated systems such as space craft, are three inches by three inches.

Following conventional techniques, a multichip module is mounted on the printed wiring board using an interfacial bond of conductive epoxy at the corners and the center of the multichip module, which produces a structural bond, a thermal transfer path and an electrical ground path, all through the printed wiring board.

But this conventional attachment technique has several disadvantages. Because epoxy is used, removing the multichip module for repair and replacement is very difficult. To ensure that the epoxy is applied at the center of the multichip module and provide for mass solder reflow during the soldering process, a squirt hole must be placed in the printed wiring board. After the edge connections on the module are soldered to the printed wiring board, the epoxy is injected into the squirt hole. Many multichip modules have circuit components on both sides of the substrate and the space required for the squirt hole and the epoxy reduces the space available for components beneath the substrate. Moreover, with "double sided" multichip modules that have a second seal cavity and lid below the substrate, epoxy attachment at the center of the module is not possible. Even with the center epoxy attachment, mechanical stresses along the epoxy corner connection sometime produce circuit and connection failures on the module, especially in high G force conditions and when there are substantial temperature gradients along the module.

DISCLOSURE OF THE INVENTION

An object of the present invention is to provide a superior technique for mounting multichip and single modules on a printed wiring board.

According to the invention, a "tripod" mount technique is employed to attach a module to the printed wiring board. That is, the thermal and electrical connection between the board and the substrate is made through three points using a thermally and electrically conductive foot (pad) at each point.

According to one aspect of the invention, the foot (pad) pattern defines an isosceles triangle; that is, the distance between one foot (pad) and the other two feet (pad)s is the same.

According to the invention each foot (pad) comprises a high temperature solder block that is vapor phase soldered to the module. The module with the foot (pad)s and module edge leads are then vapor phase soldered to the printed wire board.

Among the benefits and features of the invention, more space is available below the module for components. Also, the module can be removed by hot gas solder reflow techniques using vacuum pickup, making it feasible to replace the module and reuse the printed wire board.

A particular feature of the invention is that it provides space between the wiring board and substrate, which reduces the thermal expansion mismatch stresses between the substrate and board.

Another feature is that the "tripod" arrangement minimizes stresses resulting from board surface deflections through all vibration mode shapes.

Other objects, benefits and features of the invention will be apparent from the following discussion of one or more embodiments.

BEST MODE FOR CARRYING OUT THE INVENTION

Figure 1:
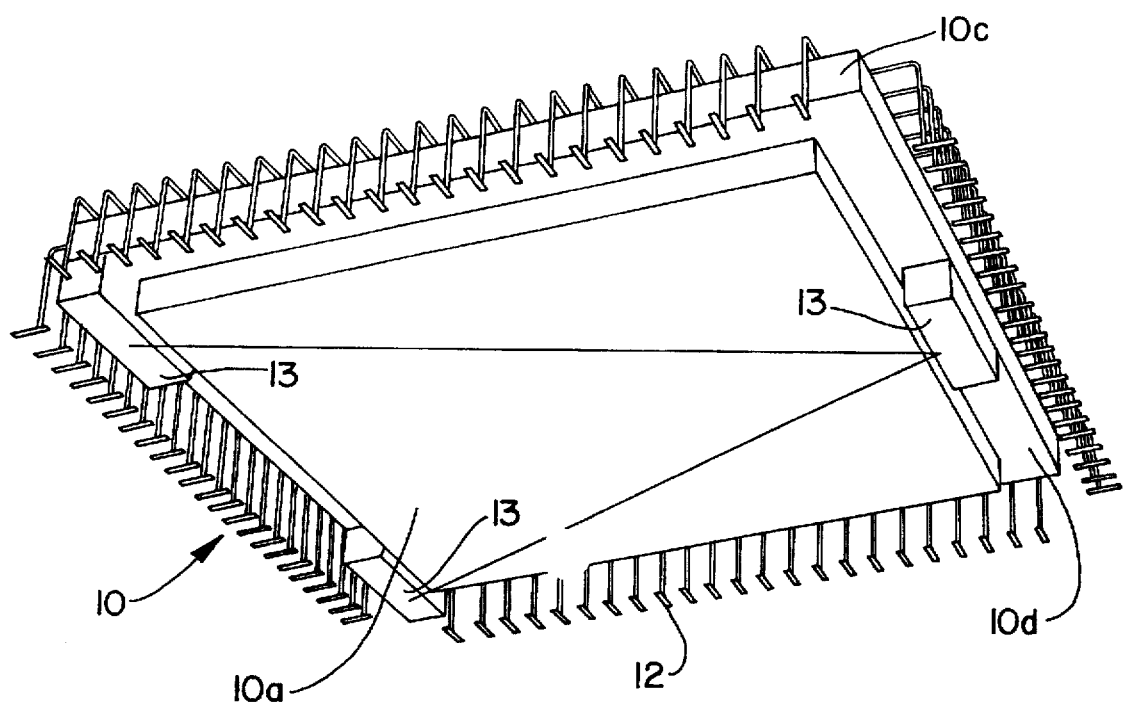
FIG. 1 is a perspective of the bottom of a multichip module embodying the present invention.
Figure 2:
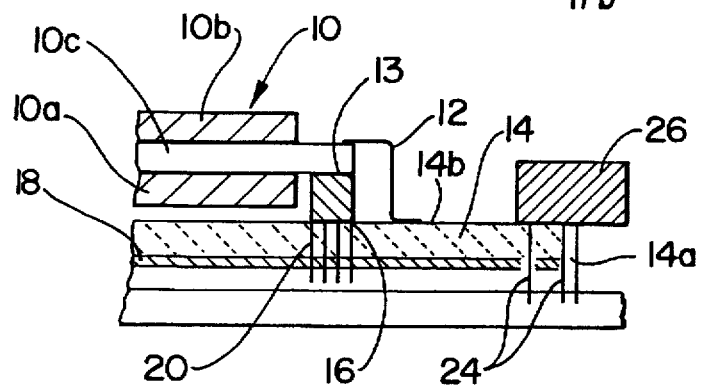
FIG. 2 is a section in plan showing the edge of a multichip module on a printed wire circuit board according to the invention and the board's connection with a chassis wall.

FIGS. 1 and 2 show a double-sided multichip module 10. A lid 10a coves integrated circuits and other components on the bottom of the module and lid 10b (visible in FIG. 2) covers components on the top of the module. The components are attached to the module's substrate 10c, which contains circuit vias (not shown, but well known) on the top surface to which wires or leads 12 are soldered for providing power and signal connections to the components. Thermal feet (pads) 13 are located in a triangular pattern on the bottom surface of the substrate 10c and adjacent to the perimeter of the lid 10a. Each foot is machined from 10Sn/90Pb (10% tin, 90% lead) solder blocks which are soldered to the conductive surface 10d on the bottom of the substrate 10c, vapor phase soldering being a preferred soldering technique. The three (3) feet create a "tripod" mount for the module 10. The module is placed on a printed wiring board 14 by soldering each foot to a conductive foot (pad) 16 on the top of the board, vapor phase soldering being a preferred technique. This is a "mass solder" reflow technique which employs the latent heat of condensation of an inert vapor, such as Flouronert® liquid available from Dupont to melt a solder past without apply excessive heat to circuit components. Another possible solder process is to use infrared heating at the solder joints, which is well known. The printed wiring board 14 includes a conductive ground plane 18, and conductors 20 extend through the board 14 to connect the ground plane 18 and the conductive foot (pad) 16. The ground plane 18 extends to the edge 14a of the board 14 to a location in proximity to but electrically isolated from thermal vias 24 which provide a thermal path to a chassis wall 26. The wires 12 are soldered to the top 14a of the printed wiring board, again using vapor phase soldering.

The multichip module can is removed, for replacement, by melting the solder joints between the feet 13 and the module 10 and board 14 and the solder connections at the wires 12 using a process such as applying a stream of hot nitrogen gas to the solder joints.

Figure 3:
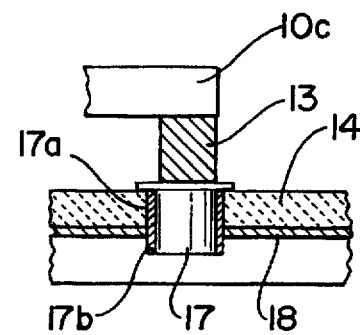
FIG. 3 is a section in plan showing the edge of a multichip module on a printed wire circuit board using an alternative embodiment of the present invention.

Referring to FIG. 3, which shows an alternative way of making the electrical and thermal connection between the feet 13 and the ground plane 18, it will be seen that rather than having the vias 20, a plug 17 is used. Each of the feet 13 is soldered to the top of the plug. The plug is formed by first plating a hole 17a with a plating material 17b and then filling the interior volume with solder.

Another way, not shown but easily understood from the above, to attach the feet 13 to the wiring board 14 is to drill a hole through the wiring board and the pad 16. A screw is inserted through the hole to tighten the foot against the pad.

Although the present invention has been described with reference to preferred embodiments, one of ordinary skill in the art will be able to make modifications and changes, in addition to any already described, in whole or in part to the components and devices described above to carry out the invention without departing from the spirit and scope of the invention.

I claim:

1. A module containing at least one circuit component mounted on a substrate and the substrate mounted on a printed wiring board having a ground plane for connection with a chassis, characterized by:

three conductive spaced apart module mounting feet arranged in a triangular pattern on one surface of the substrate, each of the feet being conductive attached to the substrate and the printed wiring board;

attachment pads on the substrate and the printed wiring board for the feet; and each of the feet being in electrical and thermal connection with the ground plane.

2. The apparatus described in claim 1, further characterized by solder attaching the feet to the substrate in that the each of the feet is made of a solderable material with a melting point higher than the melting point of the solder.

3. A method of attaching a module containing at least one circuit component mounted on a substrate to a printed wiring board, characterized by:

placing thermal and electrical conductive feet in a triangular pattern between the substrate and the printed wiring board to provide a desired distance between the substrate and the printed wiring board;

attaching said feet to conductive pads on the printed wiring circuit board that connect with a ground plane on the printed wiring circuit board; and soldering said feet to a conductive pad on the substrate by a vapor phase soldering process.

* * * * *